United States Patent
Kang

(10) Patent No.: US 6,847,576 B2
(45) Date of Patent: Jan. 25, 2005

(54) LAYOUT STRUCTURES OF DATA INPUT/OUTPUT PADS AND PERIPHERAL CIRCUITS OF INTEGRATED CIRCUIT MEMORY DEVICES

(75) Inventor: Kyung-woo Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/438,535

(22) Filed: May 15, 2003

(65) Prior Publication Data

US 2004/0004897 A1 Jan. 8, 2004

(30) Foreign Application Priority Data

Jul. 2, 2002 (KR) ......................................... 2002-37850

(51) Int. Cl.$^7$ .............................................. G11C 7/00
(52) U.S. Cl. .................... 365/230.03; 365/63
(58) Field of Search .............................. 365/230.03, 63, 365/51

(56) References Cited

U.S. PATENT DOCUMENTS

| | | | |
|---|---|---|---|
| 5,072,280 A | | 12/1991 | Matsukura .................. 357/70 |
| 5,604,710 A | * | 2/1997 | Tomishima et al. ..... 365/230.03 |
| 5,771,200 A | * | 6/1998 | Cho et al. .............. 365/230.03 |
| 5,812,490 A | * | 9/1998 | Tsukude ...................... 365/233 |
| 6,498,714 B1 | * | 12/2002 | Fujisawa et al. ......... 361/306.3 |

FOREIGN PATENT DOCUMENTS

KR         1999-40435         6/1999   ............ G11C/7/00

\* cited by examiner

*Primary Examiner*—Vu A. Le
(74) *Attorney, Agent, or Firm*—Myers Bigel Sibley & Sajovec, P.A.

(57) ABSTRACT

Integrated circuit memory devices include a first memory block. The first memory block includes first and second memory array banks and a first peripheral circuit. The first peripheral circuit is disposed between the first and second memory array banks such that a length of a first data path from the first memory array bank to the first peripheral circuit is about equal to a length of a second data path from the second memory array bank to the first peripheral circuit.

2 Claims, 1 Drawing Sheet

LAYOUT STRUCTURES OF DATA INPUT/ OUTPUT PADS AND PERIPHERAL CIRCUITS OF INTEGRATED CIRCUIT MEMORY DEVICES

RELATED APPLICATION

This application is related to and claims priority from Korean Application No. 2002-37850, filed Jul. 2, 2002, the disclosure of which is hereby incorporated herein by reference as if set forth in its entirety.

FIELD OF THE INVENTION

The present invention relates to integrated circuits and, more particularly, to layout structures of pads and peripheral circuits in integrated circuit devices.

BACKGROUND OF THE INVENTION

Input/output pads in conventional integrated circuit devices are typically arranged on one or more sides of a chip. Conventional pad layout structures are discussed in U.S. Pat. No. 5,072,280 entitled Resin Sealed Integrated Circuit and Korean Patent Publication No. 1999-40435 entitled Memory Device with a Plurality of Memory Banks Sharing Input/Output Lines, the disclosures of which are hereby incorporated herein by reference as if set forth in their entirety.

Conventional integrated circuit memory devices are configured to read data from a memory cell array and transfer the data to data input/output pads through peripheral circuits. As discussed above, the input/output pads are typically arranged on one or more sides of the chip, thus the length of the data lines associated with an array bank situated close to the input/output pads may be different, i.e. shorter, than the length of the data lines associated with an array bank situated farther from the data input/output pads. Accordingly, the data from the array banks situated farther from the data input/output pads may experience longer delays relative to the data from the array banks situated closer to the data input/output pads, i.e, data skew problems may arise as a result of the different lengths of the data paths. The presence of this delay skew may, for example, limit an operating frequency of an integrated circuit memory device.

SUMMARY OF THE INVENTION

Embodiments of the present invention provide integrated circuit memory devices that include a first memory block. The first memory block includes first and second memory array banks and a first peripheral circuit. The first peripheral circuit is disposed between the first and second memory array banks such that a length of a first data path from the first memory array bank to the first peripheral circuit is about equal to a length of a second data path from the second memory array bank to the first peripheral circuit.

In some embodiments of the present invention the device further comprises a second memory block. The second memory block may include third and forth memory array banks and a second peripheral circuit. The second peripheral circuit may be disposed between the third and fourth memory array banks such that a length of a third data path from the third memory array bank to the second peripheral circuit is about equal to a length of a fourth data path from the second memory array bank to the second peripheral circuit.

In further embodiments of the present invention the device may further include a control circuit block disposed between the first memory block and the second memory block. The control circuit block may be electrically coupled to the first and second peripheral circuits through a first control signal path and a second control signal path. The length of the first control signal path may be about equal to the length of the second control signal path.

In still further embodiments of the present invention the device may further include a first plurality of data input/output pads disposed between the first memory array bank and the second memory array bank. The first plurality of data input/output pads may be configured to communicate with the first peripheral circuit. A second plurality of data input/output pads may also be provided disposed between the third memory array bank and the fourth memory array bank. The second plurality of data input/output pads may be configured to communicate with the second peripheral circuit.

In some embodiments of the present invention the device may further include a first control circuit block disposed between the first memory block and the second memory block. A third memory block may also be provided. The third memory block may include fifth and sixth memory array banks and a third peripheral circuit. The third peripheral circuit may be disposed between the fifth and sixth memory array banks such that a length of a fifth data path from the fifth memory array bank to the third peripheral circuit is about equal to a length of a sixth data path from the sixth memory array bank to the third peripheral circuit. The third memory block may be disposed adjacent to the first memory block on the same side of the first control circuit block. A fourth memory block may also be provided. The fourth memory block may include seventh and eight memory array banks and a fourth peripheral circuit. The fourth peripheral circuit may be disposed between the seventh and eighth memory array banks such that a length of a seventh data path from the seventh memory array bank to the fourth peripheral circuit is about equal to a length of an eighth data path from the eighth memory array bank to the fourth peripheral circuit. The fourth memory block may be disposed adjacent to the second memory block on the same side of the first control circuit block.

In further embodiments of the present invention the device may further include second and third control circuit blocks. A length of a first control signal line from the second control circuit to the first peripheral circuit in the first memory block may be about equal to the length of a second control signal line from the second control circuit to the second peripheral circuit in the second memory block. A length of a third control signal line from the third control circuit to the third peripheral circuit in the third memory block may be about equal to the length of a fourth control signal line from the third control circuit to the fourth peripheral circuit in the fourth memory block.

DETAILED DESCRIPTION OF EMBODIMENTS OF THE PRESENT INVENTION

Figure 1:
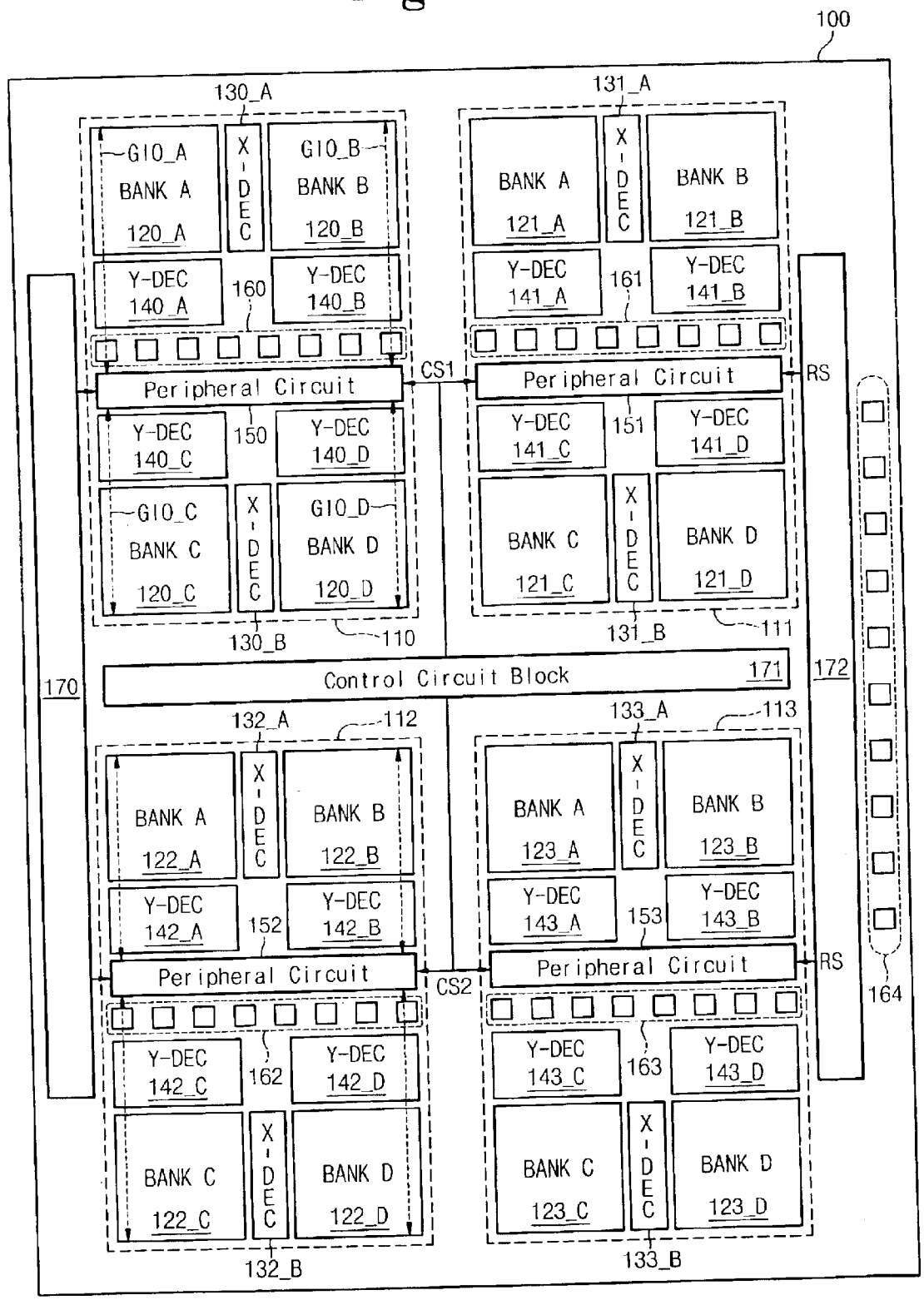
FIG. 1 illustrates a layout structure of integrated circuit memory devices according to some embodiments of the present invention.

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

It will be understood that although terms such as first, second etc. are used herein to describe various components of the integrated circuit device, these components should not be limited by these terms. These terms are only used to distinguish one component from another component. Thus, a first component discussed below could be termed a second component, and similarly, a second component may be termed a first component without departing from the teachings of the present invention.

Embodiments of the present invention will be described below with respect to FIG. 1. Embodiments of the present invention may provide layout structures for input/output pads and peripheral circuits of an integrated circuit device that may reduce the delay skew caused by different lengths of different data paths in a single chip. For example, in certain embodiments of the present invention, the length of the data lines/path may be equalized, thus providing a similar delay associated with ones of the data paths. The reduction of delay skew may provide reduced operating currents as discussed further herein.

Referring now to FIG. 1, a layout structure of an integrated circuit device, for example, an integrated circuit memory device, according to some embodiments of the present invention will be discussed. As illustrated in FIG. 1, an integrated circuit memory device 100 includes first through fourth memory blocks 110, 111, 112 and 113, first through third control circuit blocks 170, 171 and 172 and a control pad group 164. It will be understood that although the memory device 100 of FIG. 1 includes four memory blocks, three control circuit blocks and a single control pad group, the present invention is not limited to this configuration. Any number of ones of these elements may be combined in a memory device without departing from the teachings of the present invention. Furthermore, although the control pad group is illustrated as including ten data input/output pads, the present invention is not limited to this configuration. The control pad group may include more or less than ten data input/output pads without departing from the teachings of the present invention.

As illustrated in FIG. 1, first and second memory blocks 110 and 111 are situated in an upper portion of the memory device 100 above the second control circuit block 171 and third and forth memory blocks 112 and 113 are disposed in a lower portion of the memory device 100 below the control circuit block 171. The first through fourth memory blocks 110, 111, 112 and 113 will be discussed simultaneously as each of the first through fourth memory blocks 110, 111, 112 and 113 contain similar elements.

As further illustrated in FIG. 1, a memory block 110, 111, 112, 113 according to embodiments of the present invention may include first through fourth memory cell array banks 120__A to 120__D, 121__A to 121__D, 122__A to 122__D, 123__A to 123__D. Data may be input into and/or output from the memory block 110, 111, 112, 113 in, for example, byte units, i.e. 8-bits of data at a time. However, it will be understood that any number of bits may be used without departing from the teachings of the present invention. The memory cell array banks 120__A to 120__D, 121__A to 121__D, 122__A to 122__D, 123__A to 123__D may be arranged in a matrix of rows and columns as illustrated. A first row decoder 130__A, 131__A, 132__A and 133__A may be disposed between the first and second memory cell array banks 120__A and 120__B, 121__A and 121__B, 122__A and 122__B, 123__A and 123__B disposed in an upper portion of the memory block 110, 111, 112, 113. Similarly, a second row decoder 130__B, 131__B, 132__B and 133__B is disposed between the third and fourth memory cell array banks 120__C and 120__D, 121__C and 121__D, 122__C and 122__D, 123__C and 123__D which are disposed in a lower portion of the memory block 110, 111, 112, 113.

A group of data input/output pads 160, 161, 162, 163 are disposed at a center of the memory block 110, 111, 112, 113, i.e. between the first and second memory cell array banks 120__A and 120__B, 121__A and 121__B, 122__A and 122__B, 123__A and 123__B and the third and fourth memory cell array banks 120__C and 120__D, 121__C and 121__D, 122__C and 122__D, 123__C and 123__D. It will be understood that although the group of data input/output pads illustrated in the memory block of FIG. 1 includes eight data input/output pads, the present invention is not limited to this configuration. The group of data input/output pads may have more or less than eight data input/output pads without departing from the teachings of the present invention. For example, the number of pads may be modified based on the number of data bits being input and/or output in parallel to/from the memory cell array banks.

A first column decoder 140__A, 141__A, 142__A, 143__A is disposed between the first memory cell array bank 120__A, 121__A, 122__A, 123__A and the data input/output pad group 160, 161, 162, 163. Similarly, a second column decoder 140__B, 141__B, 142__B, 143__B is disposed between the second memory cell array bank 120__A, 121__A, 122__A, 123__A and the data input/output pad group 160, 161, 162, 163. A peripheral circuit 150, 151, 152, 153 is disposed between the data input/output pad group 160, 161, 162, 163 and the third and fourth memory banks 120__C and 120__D, 121__C and 121__D, 122__C and 122__D, 123__C and 123__D. The peripheral circuit 150, 151, 152, 153 may include data input/output control circuits used during, for example, a read or write operation of the integrated circuit memory device. A third column decoder 140__C, 141__C, 142__C, 143__C is disposed between the peripheral circuit 150, 151, 152, 153 and the memory cell array bank 120__C, 121__C, 122__C, 123__C and a fourth column decoder 140__D, 141__D, 142__D, 143__D is disposed between the peripheral circuit 150, 151, 152, 153 and the memory cell array bank 120__D, 121__D, 122__D, 123__D.

Accordingly, in integrated circuit memory devices using the layout structure illustrated in FIG. 1, the lengths of data paths between ones of the memory cell array banks 120__A to 120__D, 121__A to 121__D, 122__A to 122__D, 123__A to 123__D and an associated peripheral circuit 150, 151, 152, 153 may be about equal. For example, the length of a data path GIO__A between the first memory cell array bank 120__A and the peripheral circuit 150 is similar in length or equal in length to that of a data path GIO__B between the second memory cell array bank 120__B and the peripheral circuit 150. Furthermore, the length of a data path GIO__C between the third memory cell array bank 120__C and the peripheral circuit 150 is similar in length or equal in length to that of a data path GIO__D between the fourth memory cell array bank 120__D and the peripheral circuit 150. Similarly, the length of the data path GIO__A between the first memory cell array bank 120\_A and the peripheral circuit 150 is similar in length or equal in length to that of the data path GIO\_C between the third memory cell array bank 120\_C and the peripheral circuit 150. The length of the data path GIO\_B between the second memory cell array bank 120\_B and the peripheral circuit 150 is similar in length or equal in length to that of the data path GIO\_D between a bank 120\_D and the peripheral circuit 150. Accordingly, because the data paths GIO\_A to GIO\_D are similar in length, the first memory block 110 may not experience a delay skew present in conventional devices including data paths having different lengths. Furthermore, the reduction of the delay skew may cause the operating current driving the data paths to be reduced. It will be understood that the data paths GIO\_A to GIO\_D are provided in the first memory block 110 for exemplary purposes only and that ones of the second through fourth memory blocks 111–113 may also include similar data paths.

As discussed above, the integrated circuit memory device further includes first, second and third control circuit blocks 170, 171 and 172. As illustrated in FIG. 1, the second control circuit block 171 is disposed at a center of the integrated circuit memory device 100, i.e. between the first and second memory blocks 110 and 111 and the third and fourth memory blocks 112 and 113. The second control circuit block 171 is connected to the peripheral circuits 150, 151, 152, and 153 through first and second control signal paths CS1 and CS2. Control signals for read/write operations may be transferred through the first and second control signal paths CS1 and CS2.

As discussed above, the peripheral circuits 150, 151, 152 and 153 according to embodiments of the present invention are disposed at the center of the memory blocks 110, 111, 112 and 113, respectively. Thus, the control signal paths CS1 and CS2 may have similar lengths and may be shorter than signal paths included in a conventional device having peripheral circuits disposed at the upper and/or lower regions of the device. Accordingly, delay caused by different lengths of control signal paths may be reduced, thus, possibly reducing the operating current that drives the control signal paths.

First and third control signal blocks 170 and 172 are disposed along the sides of the integrated circuit memory device 100 as illustrated in FIG. 1. First and third control signal blocks generate control signals for the integrated circuit memory device 100. The group of control pads 164 is disposed at an edge of the integrated circuit memory device 100. The control pad group 164 may be used to input and/or output control signals and address signals from/to, for example, an external chip or device. According to embodiments of the present invention, the length of a signal path between the third control circuit block 172 and the peripheral circuits 151 and 153 may be reduced and may be similar in length. Similarly, the length of a signal path between the first control signal block 170 and the peripheral circuits 150 and 152 may be reduced and may be similar in length.

It will be understood that embodiments of the present invention illustrated in FIG. 1 are provided for exemplary purposes only and that embodiments of the present invention are not limited to this configuration. As described above with respect to FIG. 1, a plurality of memory blocks include a peripheral circuit and data input/output pads disposed in the center of the memory blocks. The memory blocks further include memory cell array banks. Data paths between memory cell array banks and the peripheral circuits typically have lengths that are about equal. Accordingly, a delay skew caused by different lengths of data paths may be reduced and operating currents that drive the control signal paths can, thus, also be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device comprising:
   a first memory block that comprises first and second memory array banks and a first peripheral circuit, the first peripheral circuit being disposed between the first and second memory array banks such that a length of a first data path from the first memory array bank to the first peripheral circuit is about equal to a length of a second data path from the second memory array bank to the first peripheral circuit;
   a second memory block that comprises third and fourth memory array banks and a second peripheral circuit, the second peripheral circuit being disposed between the third and fourth memory array banks such that a length of a first data path from the third memory array bank to the second peripheral circuit is about equal to a length of a fourth data path from the second memory array bank to the second peripheral circuit;
   a first control circuit block disposed between the first memory block and the second memory block;
   a third memory block that comprises fifth and sixth memory array banks and a third peripheral circuit, the third peripheral circuit being disposed between the fifth and sixth memory array banks such that a length of a fifth data path from the fifth memory array bank to the third peripheral circuit is about equal to a length of a sixth data path from the sixth memory array bank to the third peripheral circuit, wherein the third memory block is disposed adjacent to the first memory block on the same side of the first control circuit block; and
   a fourth memory block comprising seventh and eight memory array banks and a fourth peripheral circuit, the fourth peripheral circuit being disposed between the seventh and eighth memory array banks such that a length of a seventh data path from the seventh memory array bank to the fourth peripheral circuit is about equal to a length of an eighth data path from the eighth memory array bank to the fourth peripheral circuit, wherein the fourth memory block is disposed adjacent to the second memory block on the same side of the first control circuit block.

2. The device of claim 1 further comprising:
   second and third control circuit blocks;
   wherein a length of a first control signal line from the second control circuit to the first peripheral circuit in the first memory block is about equal to the length of a second control signal line from the second control circuit to the second peripheral circuit in the second memory block; and
   wherein a length of a third control signal line from the third control circuit to the third peripheral circuit in the third memory block is about equal to the length of a fourth control signal line from the third control circuit to the fourth peripheral circuit in the fourth memory block.

* * * * *